United States Patent [19]

Saito et al.

[11] Patent Number: 4,760,279
[45] Date of Patent: Jul. 26, 1988

[54] NOISE CANCELLING CIRCUIT

[75] Inventors: Tomotaka Saito, Yokohama; Kazumasa Ando; Akira Wada, both of Kawasaki, all of Japan

[73] Assignee: Kabushiki Kaisha Toshiba, Kawasaki, Japan

[21] Appl. No.: 66,094

[22] Filed: Jun. 24, 1987

[30] Foreign Application Priority Data

Jul. 2, 1986 [JP] Japan .................................. 61-155708
Jan. 6, 1987 [JP] Japan ...................................... 62-830

[51] Int. Cl.$^4$ ............................................. H03K 5/22
[52] U.S. Cl. .................................. 307/234; 307/451; 307/520; 328/111
[58] Field of Search ............... 307/234, 448, 451, 517, 307/518, 520; 328/111, 165

[56] References Cited

U.S. PATENT DOCUMENTS 4,216,388 8/1980 Wilson ................................ 307/234

OTHER PUBLICATIONS

Japanese Patent Disclosure (KOKAI) No. 50-134751; Noise Cancelling Circuit, J. Kishimoto; filed Apr. 15, 1974.
Japanese Patent Disclosure (KOKAI) No. 51-15362; Noise Canceller for Digital Data Transmission Circuit; N. Ishibashi filed Jul. 29, 1974.

Primary Examiner—Eugene R. LaRoche
Assistant Examiner—Steven J. Mottola
Attorney, Agent, or Firm—Finnegan, Henderson, Farabow, Garrett & Dunner

[57] ABSTRACT

A noise cancelling circuit includes a delay circuit for delaying an input signal which is supplied to an input terminal, and a signal processing circuit responsive to the input signal and an output signal from the delay circuit, to generate an output signal corresponding to the input signal. The signal processing circuit has a first switching circuit, which includes first and second switching elements connected in series between a first power supply terminal and an output, and a second switching circuit, which includes third and fourth switching elements connected in series between a second power supply terminal and the output, wherein the first and third switching elements are responsive to the aforementioned input signal, by which they are set in mutually opposite conduction states, and the second and fourth switching elements are responsive to the output signal of the delay circuit, by which they too are set in mutually opposite conduction states.

13 Claims, 5 Drawing Sheets

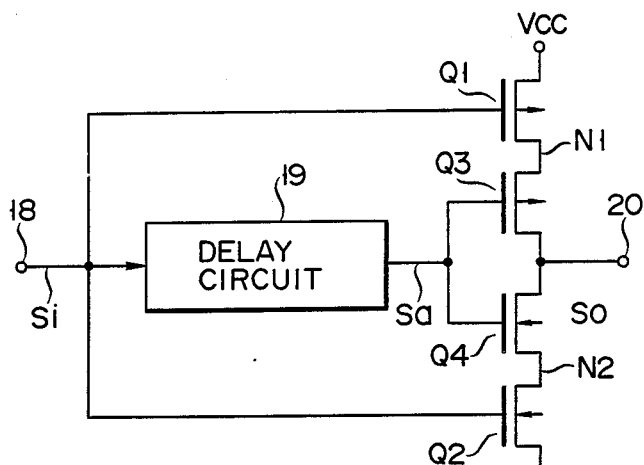
F I G. 4
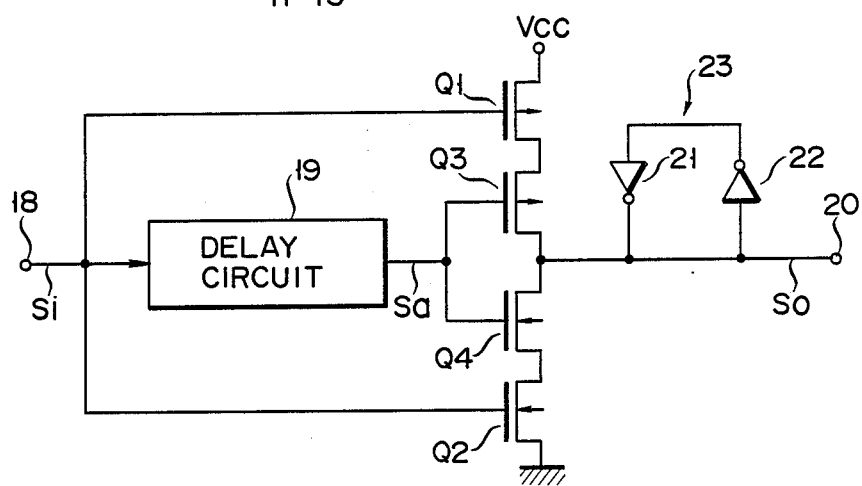
F I G. 6

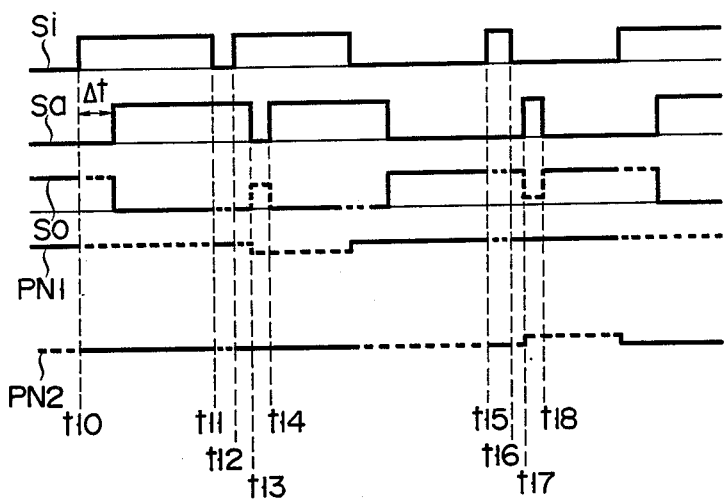
FIG. 7A
FIG. 7B
FIG. 7C
FIG. 7D
FIG. 7E
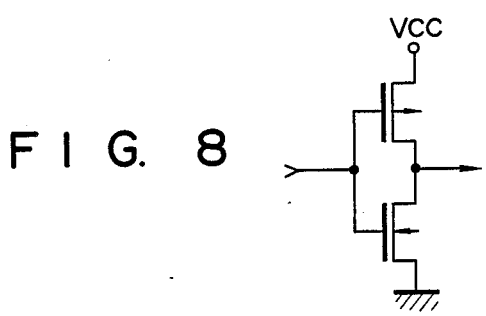
FIG. 8
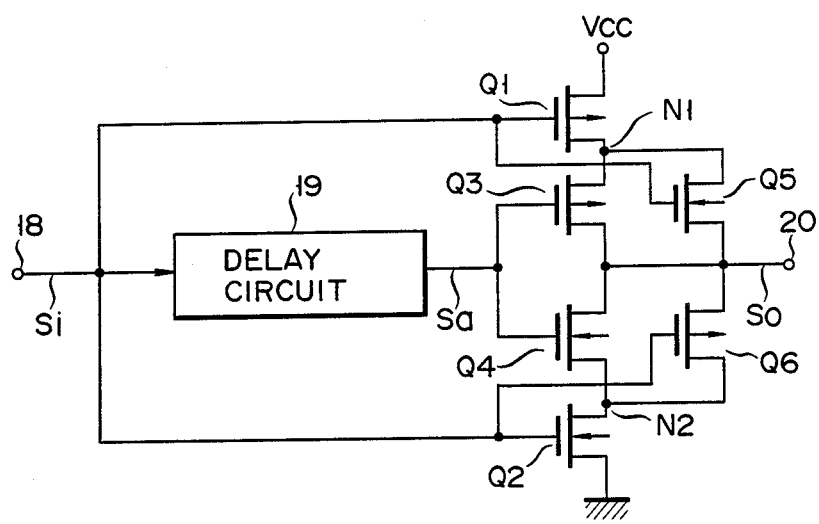
FIG. 9

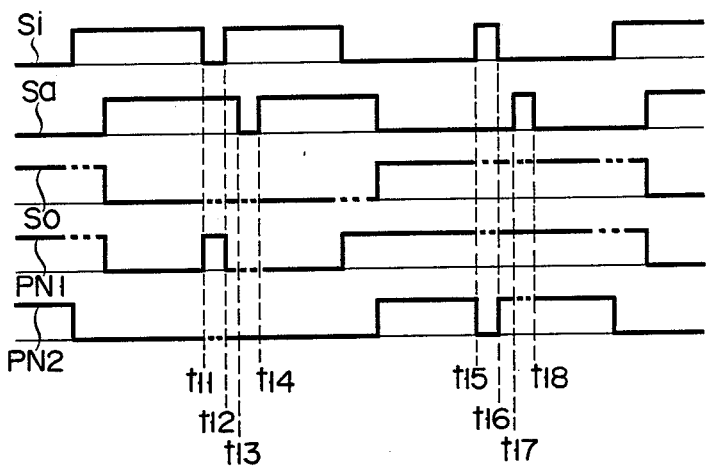
FIG. 10A Si
FIG. 10B Sa
FIG. 10C {
FIG. 10D { So
FIG. 10E { PN1
PN2
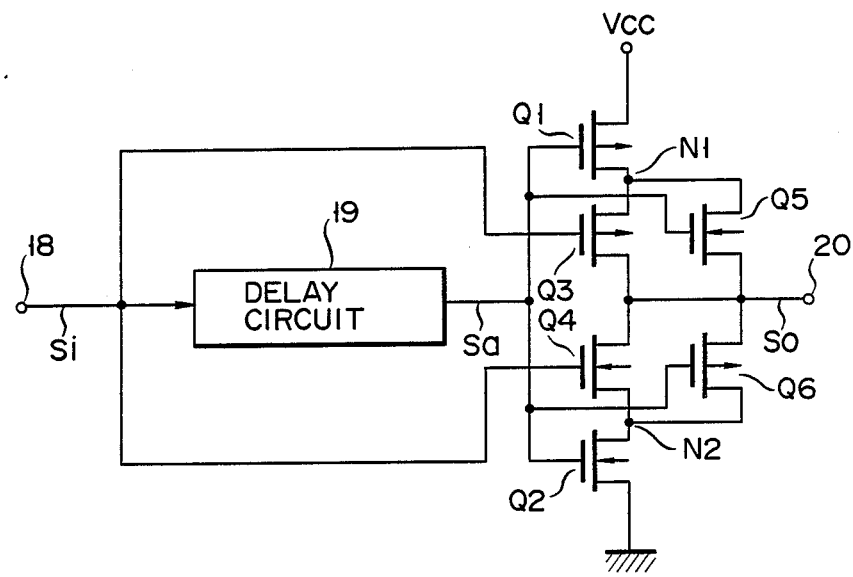
FIG. 11

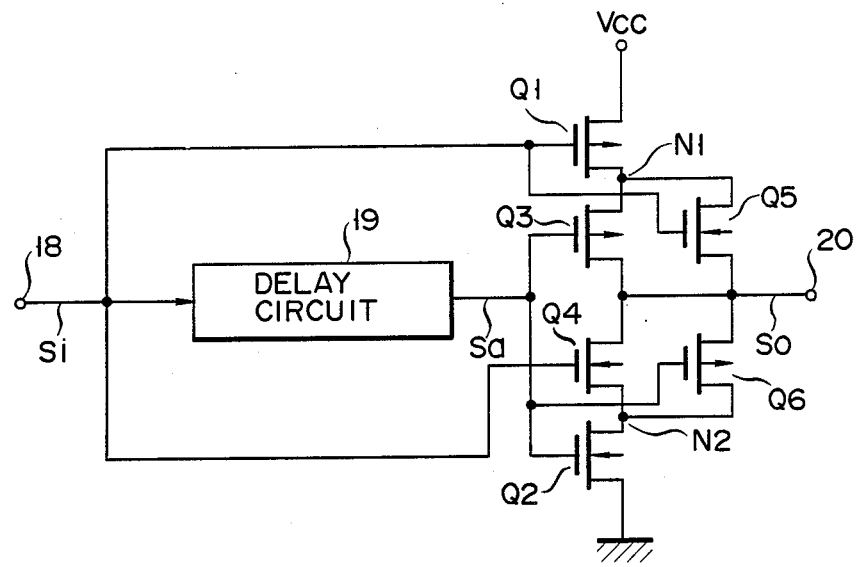
F I G. 12
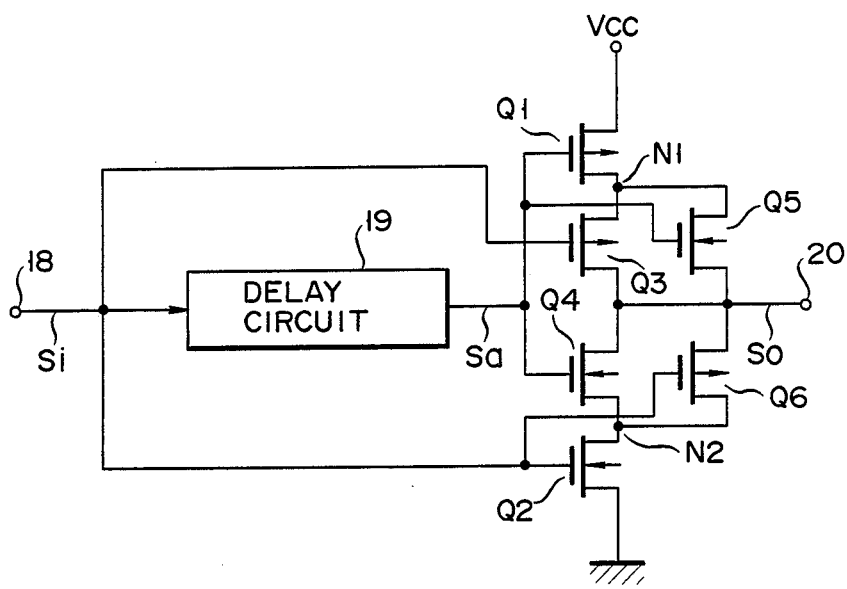
F I G. 13

NOISE CANCELLING CIRCUIT

BACKGROUND OF THE INVENTION

This invention relates to a noise cancelling circuit for cancelling noise contained in a signal.

Circuits as shown in FIGS. 1 to 3 are known as noise cancelling circuits. These circuits are disclosed on page 738 of the "Tokkyo Pulse Kairo Gijitsu Jiten" Dictionary, which is co-edited by Y. Suzuki and T. Higuchi, and issued by Ohm Co., Ltd. These circuits are suitable in the case where a noise to be cancelled out is known beforehand as being either high ("H") or low ("L") level, and is comprised of delay circuit 11 and AND gate 12, as is shown, for example, in FIG. 1. When, in the circuit arrangement shown in FIG. 1, an input signal Si is supplied to input terminal 13, it is delivered to one input terminal of AND gate 12 and to delay circuit 11, the output signal of which is supplied to the other input terminal of AND gate 12 through delay circuit 11, where it is delayed a predetermined period of time. An output signal So is obtained from output terminal 14, which is connected to the output of AND gate 12. AND gate 12 produces an "H" output signal when it receives an "H" input signal Si, and the "H" output signal Sa of delay circuit 11 and an "L" output signal when it receives the other combination of these signals Sa and Si. As a result, delay circuit 11 can eliminate a positive noise level if the delay time is set longer than the duration of the noise. Where, on the other hand, a negative noise level is to be eliminated, an OR gate is employed in place of AND gate 12.

In this type of noise cancelling circuits, two such circuits have to be selectively employed, depending on whether an "H" or an "L" level noise is to be cancelled. However, the circuit arrangement of FIG. 1 cannot be employed in the situation where, as in the case of recent microcomputers, a meaningful signal can be set, by means of a program, at either an "H" or an "L" level.

In order that the aforementioned drawback can be eliminated and hence to perform a function with respect to both the positive and negative noise levels, a 2-stage circuit arrangement is employed, using two delay circuits, 11A and 11B, AND gate 12A, and OR gate 12B, as shown in FIG. 2. With this circuit arrangement, it is only necessary to, after eliminating a positive noise level at the preceding stage, cancel a negative noise level at the following stage. Alternatively, use can be made of majority decision logic circuit 17 which is comprised of AND gates 15A to 15C and NOR gate 16, as shown in FIG. 3, whereby the majority decision logic may be taken among the input signal Si, output signal Sa of delay circuit 11A, and output signal Sb of delay circuit 11B. However, the circuit arrangements as shown in FIGS. 2 and 3 are quite complex, and result in an increase in the number of elements required and in the amount of space taken up by the circuit pattern.

SUMMARY OF THE INVENTION

Accordingly, it is the object of this invention to provide a noise cancelling circuit which can positively cancel out a noise of positive or of negative level, without increasing the compexity of any associated circuit arrangement.

According to this invention, a noise cancelling circuit is provided, which comprises:
an input terminal and an output terminal;
a delay circuit for delaying an input signal which is supplied to the input terminal;
a first switching circuit, including first and second switching elements connected in series between a first power supply terminal and the output terminal, and controlled in their conductive state by the input signal and an output signal from the delay circuit; and
a second switching circuit, including third and fourth switching elements connected in series between a second power supply terminal and the output terminal, and controlled in their conductive state by the input signal and the output signal from the delay circuit, wherein
the first and third switching circuits are responsive to the input signal, by which they are set in mutually opposite conductive states, and
the second and fourth switching circuits are responsive to the output signal of the delay circuit, by which they are set in mutually opposite conductive states.

According to this invention, when the level of an input signal varies, an output node between the first and second switching circuits is set in a high impedance state, and thus a previous output state is held over a delay time period of the delay circuit, thereby positively cancelling out a noise whose duration is shorter than the delay time of the delay circuit.

BRIEF DESCRIPTION OF THE DRAWINGS

FIG. 4 is a noise cancelling circuit according to one embodiment of this invention;

FIG. 6 shows a noise cancelling circuit according to another embodiment of this invention;

FIGS. 7A,7B,7C,7D,7E together constitute a signal waveform diagram for explaining the operation of a noise cancelling circuit according to another embodiment of this invention;

FIG. 8 is a circuit diagram showing an inverter of a latch circuit for use in the embodiment shown in FIG. 6;

FIG. 9 shows a noise cancelling circuit according to yet another embodiment of this invention;

FIGS. 10A, 10B, 10C, 10D, and 10E together constitute a signal waveform diagram for explaining the operation of the noise cancelling circuit shown in FIG. 9; and FIGS. 11 12 and 13 show a variant of the noise cancelling circuit shown in FIG. 9.

DETAILED DESCRIPTION OF THE PREFERRED EMBODIMENT

A noise cancelling circuit according to one embodiment of this invention will now be explained below, with reference to FIG. 4.

Input terminal 18 for receiving an input signal Si is connected to the gate of P-channel type MOS transistor Q1, to the gate of N-channel type MOS transistor Q2, and to the input terminal of delay circuit 19, another electrode of P-channel type MOS transistor Q being connected to a power supply Vcc, and that of N-channel type MOS transistor Q2 being connected to a ground terminal. A series-circuit of P-channel type MOS transistor Q3 and N-channel type MOS transistor Q4 is connected between the remaining terminals of MOS transistors Q1 and Q2. The output of delay circuit 19 is connected to the gates of MOS transistors Q3 and Q4. An output signal So is obtained from output terminal 20, which is connected to a junction of MOS transistors Q3 and Q4.

Figure 5A:
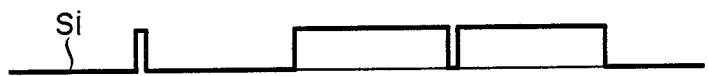
FIGS. 5A, 5B and 5C together constitute a signal waveform diagram for explaining the operation of the noise cancelling circuit shown in FIG. 4.

The operation of the aforementioned noise cancelling circuit will be explained below, with reference to FIGS. 5A to 5C.

Figure 5B:
Figure 5C:
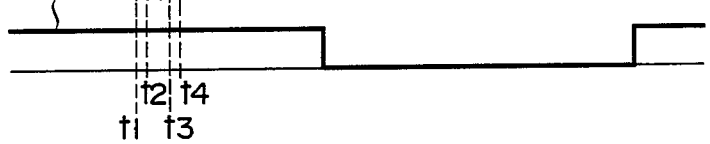

Assume that a "normally L" level signal is input to input terminal 18, as shown in FIG. 5. In this case, MOS transistors Q1 and Q3 are turned ON and MOS transistors Q2 and Q4 are turned OFF, with the result that a high-level output signal So is obtained as shown in FIG. 5C. Now suppose that, in this state, an inherently meaningless, short and positive going pulse (noise) is supplied over a time period t1 to t2. In this case, an "H" level signal is temporarily supplied to the gates of MOS transistors Q1 and Q2, turning MOS transistor Q1 OFF and MOS transistor Q2 ON. At this time, the output signal Sa of delay circuit 19 is held in its previous output state, i.e., at an "L" level, due to a delay period of a predetermined time duration, as shown in FIG. 5B, and MOS transistors Q3 and Q4 are placed in the ON and OFF states, respectively, with the result that output terminal 20 assumes a substantially electrically floating state, i.e., a high impedance state. In a practical circuit, since a load capacitor is connected to output terminal 20, the previous output level (the "H" level) is maintained as such. If the aforementioned noise duration is shorter than a delay time Δt of delay circuit 11, MOS transistors Q1 and Q2 are placed in the ON and OFF states, respectively, before an "H" level noise reaches the gates of MOS transistors Q3 and Q4. Therefore, even where, during the time period t3 to t4, transistors Q4 and Q3 are placed in the ON and OFF states, respectively, by a delay noise signal Sa output terminal 20 enters a high impedance state, so that the output signal So is not affected by the noise.

An "L" level noise can also be cancelled in the "H" level input signal Sa.

FIG. 6 shows a noise cancelling circuit according to another embodiment of this invention. Latch circuit 23 comprised of inverters 21 and 22 is added to the output terminal of the circuit shown in FIG. 4. In this circuit, the same reference numerals designate parts and elements corresponding to those shown in FIG. 4, and thus further explanation thereof is omitted. According to this invention, it is possible to implement a static type noise cancelling circuit, so that the output state can be positively maintained by latch circuit 23, even if delay circuit 19 has a longer delay time Δt.

When, in the noise cancelling circuit shown in FIG. 4, the input signal Si and corresponding signal Sa, delayed by delay circuit 19, are both at the same level, output terminal emits an output signal Eo which corresponds to that signal level. When, on the other hand, signals Si and Sa differ from each other in their respective levels, a potential on output terminal 20 is invariably held in a dynamic fashion. In this way, a noise having a time duration which is shorter than the delay time of delay circuit 19 can be cancelled effectively.

As will be explained below, it may sometimes happen that, under a specific set of conditions an operation error may occur in the aforementioned circuit. In the case where a load capacitance which is connected to output terminal 20 is smaller than a capacitance on connection node N1 between MOS transistors Q1 and Q3, or a capacitance on node N2 between MOS transistors Q4 and Q2, the logic level may sometimes be inverted when the output is held in a dynamic fashion, with the result that the circuit becomes unstable.

The operation of the noise cancelling circuit will now be explained in more detail, with reference to the timing chart of FIGS. 7A to 7E.

When, at time t10, input signal Si changes from ground level (the "L" level) to a power supply potential level (the "H" level), as is shown in FIG. 7A, the MOS transistors Q1 and Q2 are placed in the OFF and ON states, respectively. As is shown in FIG. 7B, after being delayed, from time t10, by a delay time Δt of delay circuit 19, signal Sa becomes "H" level, with the result that MOS transistors Q3 and Q4 are placed in the OFF and OFF states, respectively. As a result, output signal So becomes "L" level. When, in this state, an "L" level noise overlaps with the input signal Si at time t11, MOS transistors Q1 and Q2 are placed in the ON and OFF states, respectively. At this time, since MOS transistors Q3 and Q4 maintain their conductive states until time t13 is reached, at which point the output Sa of delay circuit 19 is inverted, the DC current path between the power supply terminal Vcc and output terminal 20 and$_o$ that between the ground and output terminal 20 are both interrupted, so that the output level is dynamically held at its previous "L" level, as shown in FIG. 7C. From time t11 to time t12, the connection node N1 between MOS transistors Q1 and Q3 is charged to a power supply level, by reason of the conduction state of MOS transistor Q1 and the potential level PN on the node N1 being held to "H" level, as is shown in FIG. 7D.

When, at time t12, input signal Si regains "H" level, MOS transistors Q1 and Q3 are turned OFF and MOS transistors Q2 and Q4 are turned ON, whereby output signal So becomes "L" level. Subsequently, from time t13 to t14, output signal So has to be dynamically held at "L" level, but owing to the conduction state of MOS transistor Q3, the charge, as dynamically held on node N1, flows to output terminal 20. As a result, the potential PN1 on node N1 drops slightly and, at the same time, the potential on output terminal 20 rises. If, in this case, a stray capacitance on node N1 is greater than the load capacitance, not shown, connected to output terminal 20, the voltage of the output signal So exceeds one half of the power supply voltage. As the threshold level of the CMOS circuit is normally set to one half of the power supply voltage level, the logic level of output signal So varies from the "L" to the "H" level if the voltage level of output signal So exceeds power supply level Vcc/2.

A similar situation also occurs in the case where a noise of a power supply level overlaps with the input signal Si, when the input signal Si is at "L" level. That is, when at time t15 the input signal Si changes from "L" level to "H" level, MOS transistors Q1 and Q2 are placed in the OFF and ON states, respectively, at which time MOS transistors Q3 and Q4 are turned ON and OFF, respectively. When output terminal 20 is thus set in the high impedance state, the output potential is dynamically held at the "H" level. During this time period, the node N2 between MOS transistors Q4 and Q2 is discharged to a ground level. As a result, a potential PN2 on the node N2 is held at "L" level, as is shown in FIG. 7E.

When, at time t16, input signal Si regains "L" level, MOS transistors Q1 and Q3 are turned ON and MOS transistors Q2 and Q4 are turned OFF, whereby output signal So becomes "H" level. From time t17 to time t18, output signal So has to be dynamically held at "H" level, but owing to MOS transistor Q4 being set in the ON state, any charge to be held on output terminal 20 flows into node N2, resulting in a slight rise in potential PN2 of node N2, and a fall in the potential of output terminal 20. At this time, if an accompanying stray capacitance on node N2 is greater than a load capacitance connected to output terminal 20, the potential level of the output signal So is halved with respect to the power supply potential level, so that the logic level of the output signal So varies from the "H" to the "L" level.

As has been stated above, the circuit shown in FIG. 4 may operate erroneously if the accompanying stray capacitance on the node M1 is greater than a load capacitance on output terminal 20, with the result that poor stability is involved.

The aforementioned drawback may be eliminated by connecting latch circuit 23 to output terminal 20, as shown in FIG. 6. When, through latch circuit 23 comprised of a CMOS inverter circuit of inverters 21 and 22 as shown in FIG. 8, the output signal So on output terminal 20 is to be inverted, a DC path is temporarily created from the power supply terminal for inverter 21 to the ground terminal through the P-channel type MOS transistor for inverter 21 and then through MOS transistors Q4 and Q2 in the noise cancelling circuit, or from the power supply terminal Vcc to the ground terminal in the noise cancelling circuit through MOS transistors Q1 and Q3 and then through the N-channel type MOS transistor for inverter 21. Thus a new problem may arise, due to a flow of "through current" and a consequent increase in consumption current.

FIG. 9 shows a noise cancelling circuit according to another embodiment of this invention, whereby the aforementioned problem can be effectively solved. The noise cancelling circuit is similar to that of FIG. 4, except for the addition of N- and P-channel MOS transistors Q5 and Q6 having the gates connected to input terminal 18. In this circuit, MOS transistors Q5 and Q6 are connected between output terminal 20 on one hand and nodes N1 and N2 on the other hand.

The operation of the noise cancelling circuit will be explained below with reference to the timing chart shown in FIGS. 10A to 10E. Explanation will be given of the operation which is involved when a noise of a ground level ("L" level) overlaps with an input signal Si (time t11) with the input signal Si set at a power supply level ("H" level). In this state, MOS transistors Q1 and Q4 are rendered in the conductive state and MOS transistors Q2 and Q3 are rendered in the nonconductive state. In this state, a DC path between the power supply terminal Vcc and output terminal 20 and that between the ground terminal and output terminal 20 are interrupted, so that output terminal 20 is dynamically held at an "L" level as shown in FIG. 10C. The node N1 is charged to a power supply level because MOS transistor Q1 is rendered in the ON state. The potential PN1 on the node Nl becomes an "H" level as shown in FIG. 10D. Since in this case MOS transistors Q3 and Q5 are rendered nonconductive, output terminal 20 can be dynamically held in the "L" level.

At time t12, when the input signal Si regains the "H" level, MOS transistors Q1, Q3, and Q6 are turned OFF and MOS transistors Q2, Q4, and Q5 are turned ON, so that the output signal So becomes "L" level. At this time, since MOS transistor Q5 is turned ON the node N1 is discharged to the ground level through the current path of MOS transistors Q5, Q4, and Q2.

At time t13, when the input signal Sa which has passed through delay circuit 19 becomes an "L" level, as shown in FIG. 10B, MOS transistors Q1, Q4, and Q6 are turned OFF and MOS transistors Q2, Q3, and Q5 are turned OFF. Then a DC current path between the power supply terminal Vcc and output terminal 20 and that between the output terminal 20 and the ground terminal are interrupted, so that output terminal 20 is dynamically held at the "L" level. Since, in this case, MOS transistor Q3 is placed in the ON state, the node N1 is electrically connected to output terminal N1. From time t12 to time t13, the node N1 is discharged to the ground level due to the ON state of MOS transistor Q5, causing node N1 and output terminal 20 to have the same potential level. As a result, no charge transfer occurs, and thus output terminal 20 can be dynamically held at the "L" level.

At time t14, when the output signal Sa of delay circuit 19 regains "H" level, MOS transistors Q1, Q3, and Q6 are turned OFF and MOS transistors Q2, Q4, and Q5 are turned ON, so that the output signal So becomes "L" level.

Even where a noise of a ground level overlaps with the input signal Si when the input signal Si is at a power supply potential level, it can be cancelled out, and it is possible to prevent the logic level of the output signal So from being inverted due to the charge transfer between the node N1 and output terminal 20.

The operation of the noise cancelling circuit will now be explained in relation to the case where, when the input signal Si is at a ground level, a noise of a power supply level ("H" level) is mixed into the input signal Si.

When, at time t15, the input signal Si becomes "H" level, MOS transistors Q1, Q4, and Q6 are turned OFF and MOS transistors Q2, Q3, and Q5 are turned ON. Thus, a DC current path between the power supply terminal Vcc and output terminal 20 and that between output terminal 20 and the ground terminal are interrupted, so that output terminal 20 is dynamically held at the "H" level. Here, the node N2 is discharged to a ground level, due to the conduction of MOS transistor Q2, and the potential PN2 on the node N2 becomes "L" level, as shown in FIG. 10E.

At time t16, when the input signal Si regains the "L" level, MOS transistors Q1, Q3, and Q6 are turned ON and MOS transistors Q2, Q4, and Q5 are turned OFF, so that the output signal So becomes "H" level. At this time, the node N2 is charged to a power supply level, sequentially through MOS transistors Q1, Q3, and Q6, due to the conduction of MOS transistor Q6.

At time t17, when the output signal Sa of delay circuit 19 becomes "H" level, MOS transistors Q1, Q4, and Q6 are turned ON and MOS transistors Q2, Q3, and Q5 are turned OFF, so that output terminal 20 is dynamically held at the "H" level. Since, at this time, MOS transistor Q4 is turned ON, conduction is established between the node N2 and output terminal 20. From time t16 to time t17, node N2 is charged to a power supply level by MOS transistor Q5, and assumes the same level as that on output terminal 20, with the result that, due to no charge transfer having taken place, output terminal 20 is dynamically held at "H" level.

At time t18, when the output signal Sa of delay circuit 19 regains "L" level, MOS transistors Q1, Q3, and Q6 are turned ON and MOS transistors Q2, Q4, and Q5 are turned OFF, so that the output signal So becomes "H" level.

As has been set out above, even when the noise of a power supply level is mixed into the input signal Si when the input signal Si is at the ground level, it is possible to cancel out the noise, and it is also possible to prevent the logic level of the output signal from being inverted as a result of the charge transfer between the node N2 and output terminal 20.

Figure 2:
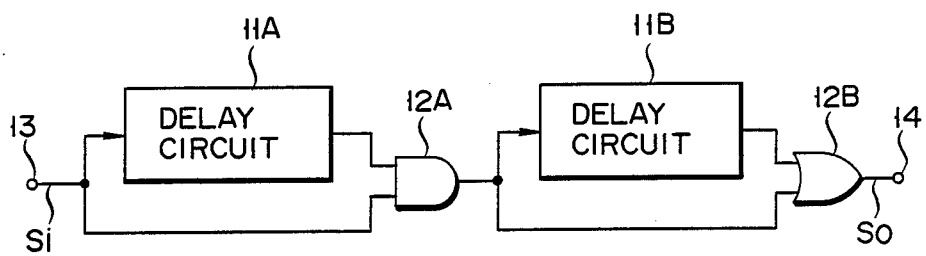
FIGS. 2 and 3 each show a conventional noise cancelling circuit for cancelling a positive and a negative noise pulse.
Figure 3:
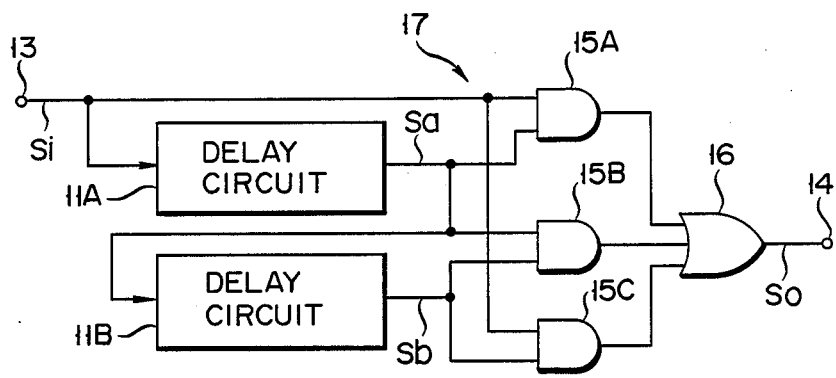

According to this invention, it is possible to provide a noise cancelling circuit whereby a stable and highly reliable operation can be anured, irrespective of the ratio of the stray capacitance from the nodes N1 and N2 and the load capacitance connected to output terminal 20. Since the noise cancelling circuit comprises six MOS transistors, in addition to the provision of delay circuit 19, it is therefore possible to obtain a noise cancelling circuit which can reduce the pattern area, as compared with that of the circuit of FIG. 2, and which can be designed with no DC current path created between the power supply terminal Vcc and the ground, with the result that power consumption can be reduced when compared with the circuit shown in FIG. 6.

Figure 1:
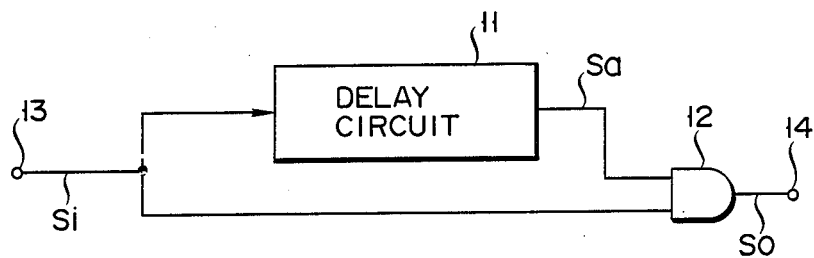
FIG. 1 shows a conventional noise cancelling circuit for cancelling a positive noise pulse.

FIG. 11 is a modification of the noise cancelling circuit shown in FIG. 9. In FIG. 11, the same reference numerals designate parts or elements corresponding to those shown in FIG. 9, and thus, further explanation is omitted, for the sake of brevity. In the noise cancelling circuit shown in FIG. 9, the input signal Si is supplied to the gates of MOS transistors Q1, Q2, Q5, and Q6, and the output signal Sa of delay circuit 19 is supplied to the gates of MOS transistors Q3 and Q4, for conduction control, whereas in the noise cancelling circuit shown in FIG. 11, the input signal Si is supplied to the gates of MOS transistors Q3 and Q4, and the output signal Sa of delay circuit 19 is supplied to the gates of MOS transistors Q1, Q2, Q5, and Q6, for conduction control. The noise cancelling circuit thus formed operates in basically the same fashion as the circuit shown in FIG. 1, and produces the same effect.

FIGS. 12 and 13 each show a modification of the noise cancelling circuit shown in FIG. 9. In the modification shown in FIG. 12, an input signal Si is supplied to the gates of MOS transistors Q1, Q4, and Q5, and an output signal Sa from delay circuit 19 is supplied to the gates of MOS transistors Q2, Q3, and Q6, for conduction control. In the circuit shown in FIG. 13, an input signal Si is supplied to the gates of MOS transistors Q2, Q3, and Q6, and the output signal Sa from delay circuit 19 is supplied to the gates of MOS transistors Q1, Q4, and Q5, for conduction control. These circuits operate in the same fashion as the circuits of FIGS. 9 and 11, and produce the same effect as those shown in FIGS. 9 and 11.

Although this invention has been explained in conjunction with the aforementioned embodiments, it is not restricted to only these embodiments. For example, MOS transistors Q1 to Q4 of the noise cancelling circuit shown, for example, in FIG. 4 may be rearranged so as to be connected as shown in FIGS. 11 to 13.

What is claimed is:

1. A noise cancelling circuit comprising:
   first and second power supply terminals;
   an input terminal and an output terminal;
   delay means for delaying an input signal supplied to said input terminal;
   a first switching circuit, including first and second switching means connected in series between the first power supply terminal and the output terminal, and controlled in their conduction state by said input signal and an output signal from said delay means; and
   a second switching circuit, including third and fourth switching means connected in series between the second power supply terminal and the output terminal,
   wherein said first and third switching means are responsive to said input signal, by which they are set in mutually opposite conduction states, and said second and fourth switching means are responsive to said output signal from said delay means, by which they are set in mutually opposite conduction states.

2. A noise cancelling circuit according to claim 1, wherein said first switching means comprises a first P-channel MOS transistor, connected at one end to a power supply terminal, and said second switching means comprises a second P-channel MOS transistor, connected between the other end of the first P-channel MOS transistor and said output terminal.

3. A noise cancelling circuit according to claim 2, wherein said third switching means comprises a first N-channel MOS transistor, connected at one end to the second power supply terminal, and said fourth switching means comprises a second N-channel MOS transistor, connected between the other end of said first N-channel MOS transistor and the output terminal.

4. A noise cancelling circuit according to claim 2, wherein said fourth switching means comprises a first N-channel MOS transistor, connected at one end to the second power supply terminal, and said third switching means comprises a second N-channel MOS transistor, connected between the other end of said first N-channel MOS transistor and said output terminal.

5. A noise cancelling circuit according to claim 1, wherein said second switching means comprises a first P-channel MOS transistor, connected at one end to the first power supply terminal, and said first switching means comprises a second P-channel MOS transistor, connected between the other end of said first P-channel MOS transistor and said output terminal.

6. A noise cancelling circuit according to claim 5, wherein said third switching means comprises a first N-channel MOS transistor, connected at one end to the second power supply terminal, and said fourth switching means comprises a second N-channel MOS transistor, connected between the other end of said first N-channel MOS transistor and said output terminal.

7. A noise cancelling circuit according to claim 5, wherein said fourth switching means comprises a first N-channel MOS transistor, connected at one end to the second power supply terminal, and said third switching means comprises a second N-channel MOS transistor, connected between the other end of said first N-channel MOS transistor and said output terminal.

8. A noise cancelling circuit according to claim 1, wherein said third switching means comprises a first N-channel MOS transistor, connected at one end to the second power supply terminal, and said fourth switching means comprises a second N-channel MOS transistor, connected between the other end of said first N-channel MOS transistor and said output terminal.

9. A noise cancelling circuit according to claim 1, wherein said fourth switching means comprises a first N-channel MOS transistor, connected at one end to the second power supply terminal, and a second channel MOS transistor, connected between the other end of said first N-channel MOS transistor and said output terminal.

10. A noise cancelling circuit according to claim 2, wherein said signal processing circuit further includes a latch circuit for latching a potential on a connection node between said first and second switching circuits.

11. A noise cancelling circuit according to claim 4, wherein said signal processing circuit further includes:
fifth switching means, connected at one end to a connection node between said first and second switching means, and at the other end to said output terminal, and responsive to said input signal, by which it is set in the same conductive state as that of said first switching means.

12. A noise cancelling circuit according to claim 1, wherein said signal processing circuit further includes a latch circuit for latching a potential on a connection node between said first and second switching circuits.

13. A noise cancelling circuit according to claim 1, wherein said signal processing circuit further includes:
fifth switching means, connected at one end to a connection node between said first and second switching means, and at the other end to said output terminal, and responsive to said input signal, by which it is set in an opposite conduction state to that of said first switching means; and
sixth switching means, connected at one end to a connection node between said third and fourth switching means, and at the other end to said output signal, and responsive to said input signal, by which it is set in the same conduction state as that of said first switching means.

* * * * *